US007317762B2

(12) United States Patent
Shahrier

(10) Patent No.: US 7,317,762 B2
(45) Date of Patent: *Jan. 8, 2008

(54) THIRD GENERATION FDD MODEM INTERLEAVER

(75) Inventor: Sharif M. Shahrier, King of Prussia, PA (US)

(73) Assignee: Interdigital Technology Corporation, Wilmington, DE (US)

( * ) Notice: Subject to any disclaimer, the term of this patent is extended or adjusted under 35 U.S.C. 154(b) by 246 days.

This patent is subject to a terminal disclaimer.

(21) Appl. No.: 11/141,961

(22) Filed: Jun. 1, 2005

(65) Prior Publication Data
US 2005/0273676 A1    Dec. 8, 2005

Related U.S. Application Data

(63) Continuation of application No. 09/908,820, filed on Jul. 19, 2001, now Pat. No. 6,947,491.

(60) Provisional application No. 60/260,930, filed on Jan. 11, 2001, provisional application No. 60/232,224, filed on Sep. 13, 2000.

(51) Int. Cl.
H04L 23/02 (2006.01)

(52) U.S. Cl. ..................... 375/262; 375/341; 714/762

(58) Field of Classification Search ........ 375/261–262, 375/265, 341, 285, 340; 714/776, 779, 790, 714/792, 701–702, 755–756, 768, 794–795, 714/762; 370/319, 344, 476; 711/157
See application file for complete search history.

(56) References Cited

U.S. PATENT DOCUMENTS

| 4,394,642 | A |   | 7/1983  | Currie |
|-----------|---|---|---------|--------|
| 5,729,560 | A | * | 3/1998  | Hagenauer et al. ......... 714/786 |
| 5,912,898 | A |   | 6/1999  | Khoury |
| 6,233,709 | B1| * | 5/2001  | Zhang et al. ............... 714/774 |
| 6,411,654 | B1|   | 6/2002  | Furutani et al. |
| 6,493,815 | B1|   | 12/2002 | Kim et al. |
| 6,553,517 | B1|   | 4/2003  | Prasad |

OTHER PUBLICATIONS

3rd Generation Partnership Project, "Technical Specification Group Radio Access Network Multiplexing and Channel Coding (FDD)", 3G TS 25 212 V3.0.0, Oct. 1999, pp. 1-54.

(Continued)

Primary Examiner—Khanh C. Tran
(74) Attorney, Agent, or Firm—Volpe and Koenig, P.C.

(57) ABSTRACT

A method and apparatus are disclosed for deinterleaving expanded interleaved data blocks, particularly for use in a wireless telecommunications system such as provided by the Third Generation Partnership Project (3G) standard. The data is processed on a sequential element basis where each element has a pre-determined number of bits M which bits are contained in a block of sequential data words W'. The elements are extracted from the block of words W' in sequential order, each element being extracted from either a single or two sequential interleaved words within the set of words W'. The elements are stored in selective location within a set of words W of a deinterleaver memory such that upon completion of the extraction and writing of all the elements, the words W from the deinterleaver memory can be sequentially read out to correspond to an original data block of bits from which the block of interleaved elements was created. Additional conventional processing results in the contraction of the deinterleaved expanded words to reproduce the data block of bits in a receiver as originally designated for transmission in a transmitter.

26 Claims, 16 Drawing Sheets

OTHER PUBLICATIONS

3RD Generation Partnership Project, "Technical Specification Group Radio Access Network Multiplexing and Channel Coding (FDD)", 3G TS 25 212 V3.0.0, Oct. 1999, pp. 1-54.

Motorola, "Complexity Analysis of the Motorola Turbo Code Interleaver," 3GPP/TSGR.1#3(99)-299, TSG-RAN Working Group 1 (Radio Layer 1) Meeting #3, (Eskiltuna, Sweden, Mar. 1999).

AD HOC #7 of TSG-RAN Working Group 1 (Radio Layer 1), "Report from AD Hoc #7: Slot Structure," TSGR1#2(99)059, TSG-RAN Working Group 1 (Radio Layer 1) Meeting #2, (Shin Yokahama Feb. 22-25, 1999).

3GPP TSG-RAN Working Group 1, "Ad Hoc #7: Summary of Discussions, " Postings by various authors from 3GPP_TSG_RAN_WG1 Archives Apr. 1999 (#271) *at* http://list.3gpp.org/scripts/3gpp_tsg_ran_wg1.html.

* cited by examiner

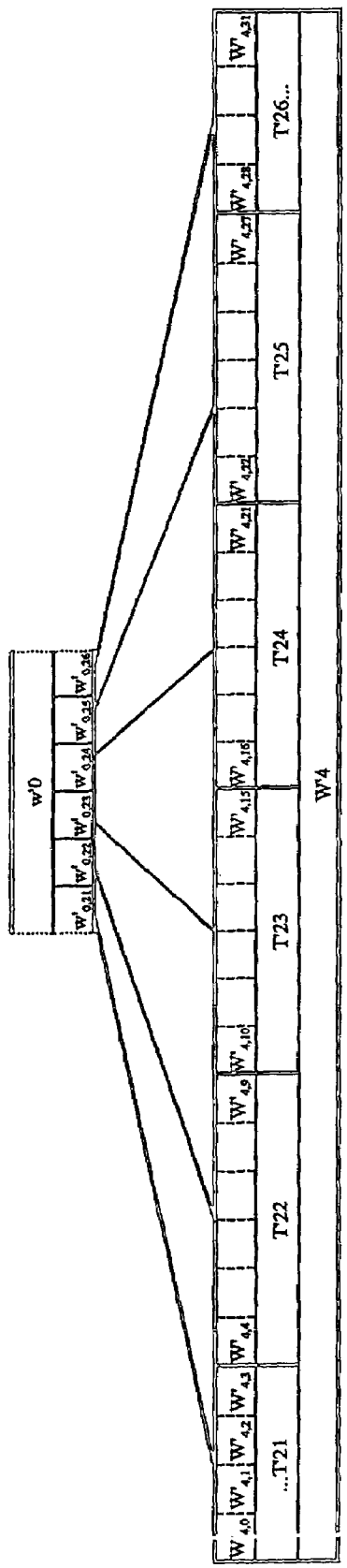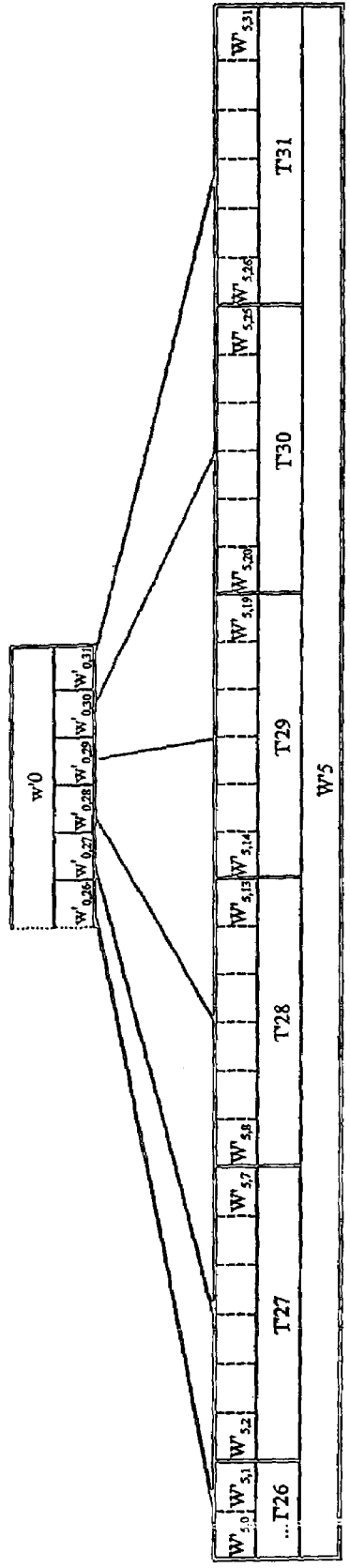
FIG. 4e (Prior Art)
FIG. 4f (Prior Art)

| | Column 0 | | | | | | Column 1 | | | | | | Column 2 ... | |
|---|---|---|---|---|---|---|---|---|---|---|---|---|---|---|
| | W"0,0 | W"0,1 | W"0,2 | W"0,3 | W"0,4 | W"0,5 | W"23,8 | W"23,9 | W"23,10 | W"23,11 | W"23,12 | W"23,13 | W"48,18 | W"48,19 |
| W"0,0 | | W"0,1 | W"0,2 | W"0,3 | W"0,4 | W"0,5 | W"23,8 | W"23,9 | W"23,10 | W"23,11 | W"23,12 | W"23,13 | W"48,18 | W"48,19 |
| W"0,6 | | W"0,7 | W"0,8 | W"0,9 | W"0,10 | W"0,11 | W"23,14 | | | | | W"23,19 | W"48,24 | |
| W"0,12 | | | | | | W"0,17 | W"23,20 | | | | | W"23,25 | W"48,30 | |
| W"0,18 | | | | | | W"0,23 | W"23,26 | | | | | W"23,31 | W"49,4 | |
| W"0,24 | | | | | | W"0,29 | W"24,0 | | | | | W"24,5 | W"49,10 | |
| W"0,30 | | W"0,31 | W"1,0 | W"1,1 | W"1,2 | W"1,3 | W"24,6 | | | | | W"24,11 | W"49,16 | |
| W"1,4 | | | | | | W"1,9 | W"24,12 | | | | | W"24,17 | W"49,22 | |
| W"1,10 | | | | | | W"1,15 | W"24,18 | | | | | W"24,23 | W"49,28 | |
| W"1,16 | | | | | | W"1,21 | W"24,24 | | | | | W"24,29 | W"50,2 | |
| W"1,22 | | | | | | W"1,22 | W"24,30 | W"24,31 | W"25,0 | W"25,1 | W"25,2 | W"25,3 | W"50,8 | W"50,9 |
| W"1,28 | | W"1,29 | W"1,30 | W"1,31 | W"2,0 | W"2,1 | W"25,4 | | | | | W"25,9 | W"50,14 | W"50,15 |

THIRD GENERATION FDD MODEM INTERLEAVER

CROSS REFERENCE TO RELATED APPLICATIONS

This application is a continuation of U.S. application Ser. No. 09/908,820 filed Jul. 19, 2001 now U.S. Pat. No. 6,947,491 which in turn claims priority from Provisional Application No. 60/260,930, filed on Jan. 11, 2001 and U.S. Provisional Application No. 60/232,224, filed on Sep. 13, 2000 which applications are all incorporated herein by reference.

The present application relates to interleaving of data in a telecommunications system. In particular, method and apparatus for de-interleaving data.

BACKGROUND

It is known in the wireless telecommunications art to scramble data through a process known as interleaving for transmitting the data from one communication station to another communication station. The data is then de-scrambled through a de-interleaving process at the receiving station.

In Third Generation Partnership Project (3G) wireless systems, a specific type of data interleaving for frequency division duplex (FDD) modems physical channel data is specified. Physical channel data in a 3G system is processed in words having a pre-defined bit size, which is currently specified as 32 bits per word.

Blocks of arbitrary numbers of sequential data bits contained within sequential data words are designated for communication over FDD physical channels. In preparing each data block for transmission over the channel, the data is mapped row by row to a matrix having a pre-determined number of columns. Preferably there are fewer columns than the number of bits in a word. Currently 30 columns are specified in 3G for physical channel interleaving of data bit blocks contained in 32 bit words.

For example, a mapping of a 310 data bit block contained as bits w0,0-w9,21 within ten 32-bit words w0-w9 to a thirty column matrix is illustrated in FIG. 1. The 310 data bit block is mapped to a 30 column matrix having 11 rows. Since the data block has a total of 310 bits, the last twenty of the columns, columns 10-29, include one fewer data bit than the first ten columns, 0-9.

Whether or not all of the matrix columns have bits of data mapped to them is dependent upon the number of bits in the block of data. For example, a block of 300 data bits would be mapped to a 30×10 matrix completely filling all the columns since 300 is evenly divisible by 30. In general, for mapping a block of T elements, the last r columns of a C column by N row matrix will only have data in N−1 rows where r=(C*N)−T and r<C.

After the data bits have been mapped to the interleaver matrix, the order of the columns is rearranged in a pre-defined sequence and the data bits are written to a new set of words w' on a column by column sequential basis to define an interleaved data block of sequential bits w'#,# in a set of sequential words w'.

For example, the 310 bit block of data contained in words w0-w9 of FIG. 1 is selectively stored to words w'0-w'9, in accordance with the preferred interleaver column sequence as shown in FIGS. 2a, 2b. For the set of words, w0-w9, the corresponding interleaved block of ten words w'0-w'9 contain all of the 310 bits of data of the original words w0-w9 in a highly rearranged/scrambled order. As shown in FIG. 2a, interleaved word w'0 is formed of a sequence of bits from columns 0, 20 and 10 of FIG. 1. The correspondence of the bits w#,# from the original words w0-w9 to the bits $w'_{0,0}$-$w'_{0,31}$ of interleaved word w'0 is illustrated in FIG. 2b.

Various processes may occur concerning the interleaved data before it is transmitted to a receiving station. For example, the bit size structure may be expanded M number of times. If the bit expansion is specified as six fold, each of the interleaved data bits for a block of physical channel data is expanded to a six bit element. Also, other processes can occur concerning the interleaved data between the transmitter and the receiving station's deinterleaver that make it appear to the receiver's deinterleaver that bit expansion has occurred even though no such bit expansion was performed in transmission processing. For example, a receiving station may sample a received signal using an A/D converter and descramble/dispread chip samples into symbols with the resulting value having a multi-bit representation. Each original interleaved bit from the transmitter then appears to have been expanded M number of times.

By way of example, the ten interleaved data words w'0-w'9 of the example of FIGS. 2a and 2b are expanded into a block of 59 words W'0-W'58 for transmission and/or during reception processing as reflected in FIG. 3. FIGS. 4a-4f illustrate an example of the correspondence of the interleaved bits w'0,0-w'0,31 of word w'0 to expanded interleaved six-bit elements T'0-T'31 of words W'0-W'5.

Since the element bit size does not evenly divide into the word bit size, some elements span two sequential words. For example, in FIGS. 4a and 4b, element T'5 is partially contained in word W'0 and partly contained in the next word W'1.

In the receiving station, after reception and processing, the received block of expanded interleaved elements, for example, the bit $W'_{0,0}$-$W'_{58,3}$ in the 59 words W'0-W'58, must be deinterleaved, i.e. descrambled, to reassemble the data in its original sequential form. It would be highly advantageous to provide a method and apparatus for deinterleaving of expanded column interleaved data blocks in a fast and efficient manner.

SUMMARY

A method and apparatus are disclosed for deinterleaving expanded interleaved data blocks, particularly for use in a wireless telecommunications system such as provided by the Third Generation Partnership Project (3G) standard. The data is processed on a sequential element basis where each element has a pre-determined number of bits M which bits are contained in a block of sequential data words W'. The elements are extracted from the block of words W' in sequential order, each element being extracted from either a single or two sequential interleaved words within the set of words W'. The elements are stored in selective location within a set of words W of a deinterleaver memory such that upon completion of the extraction and writing of all the elements, the set of words W from the deinterleaver memory can be sequentially read out to correspond to an original data block of bits from which the block of interleaved elements was created. Additional conventional processing results in the contraction of the deinterleaved expanded words to reproduce the data block of bits in a receiver as originally designated for transmission in a transmitter.

Although the method and apparatus were specifically designed for a $2^{nd}$ de-interleaving function of a 3G FDD receiver modem, the invention is readily adaptable for either scrambling and descrambling expanded data blocks for other applications.

Preferably, a multi-stage pipeline configuration is employed to process the elements in conjunction with calculating a deinterleaver memory address and selective storage of the data elements therein. Data throughput of up to 60 megabits per second has been realized using a preferred three stage pipeline. Also, multiple deinterleavers may be used parallel to process multiple blocks of data, each, for example, for a group of different physical channels, so that the deinterleaving process does not adversely impact on the overall speed of the communications system. However, since the physical channel processing of each channel is currently specified as 380 kilobits per second, the speed of a single deinterleaver in accordance with the preferred construction is more than adequate to process the data element blocks of all of physical channels of a 3G FDD receiver modem.

Other objects and advantages of the present invention will be apparent to those of ordinary skill in the art from the drawings and the following detailed description.

BRIEF DESCRIPTION OF THE DRAWINGS

Figures 1, 2B:
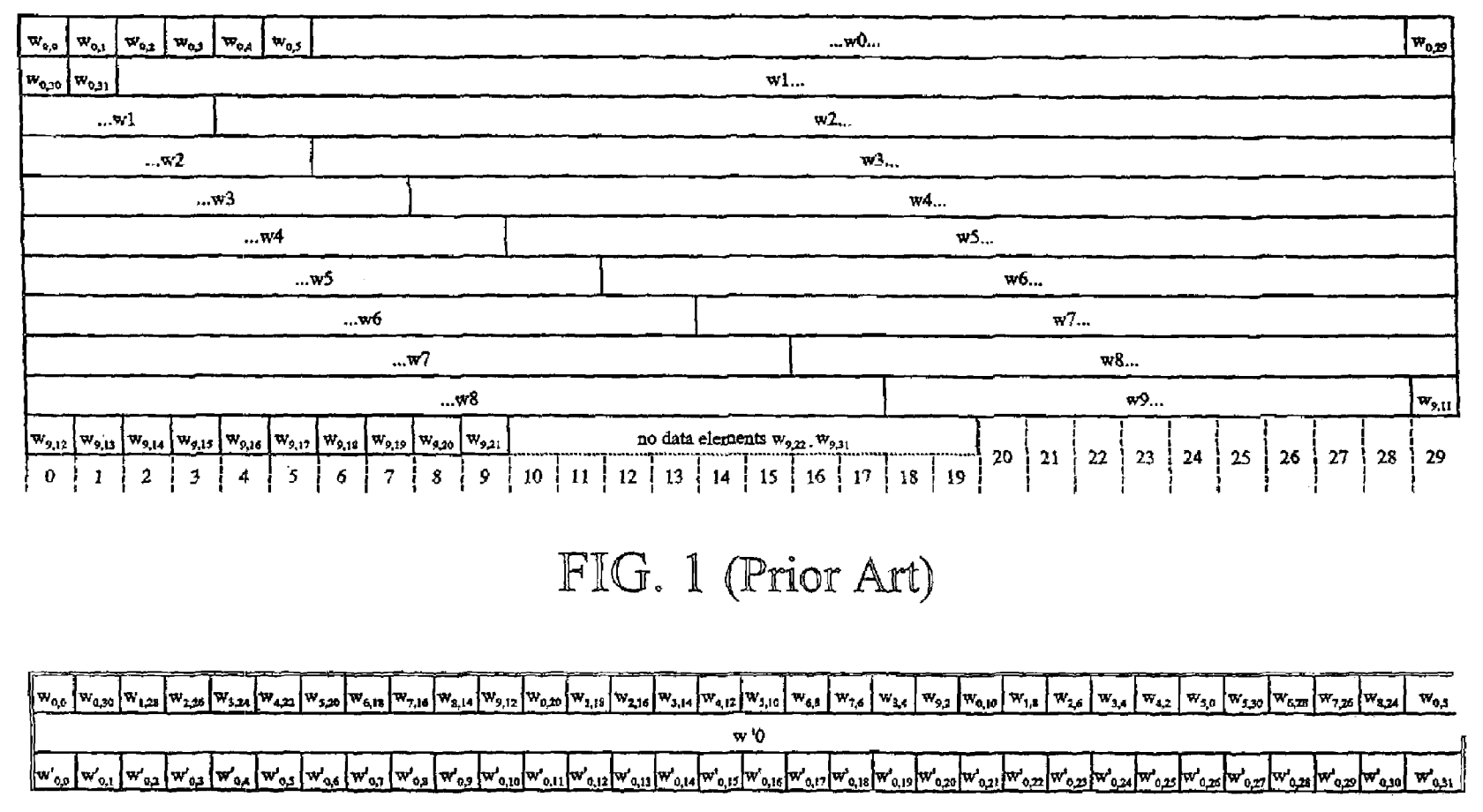

FIG. 1 illustrates a mapping of a block of 310 data bits contained in ten 32-bit words w upon a thirty column matrix.

Figures 2A, 3:
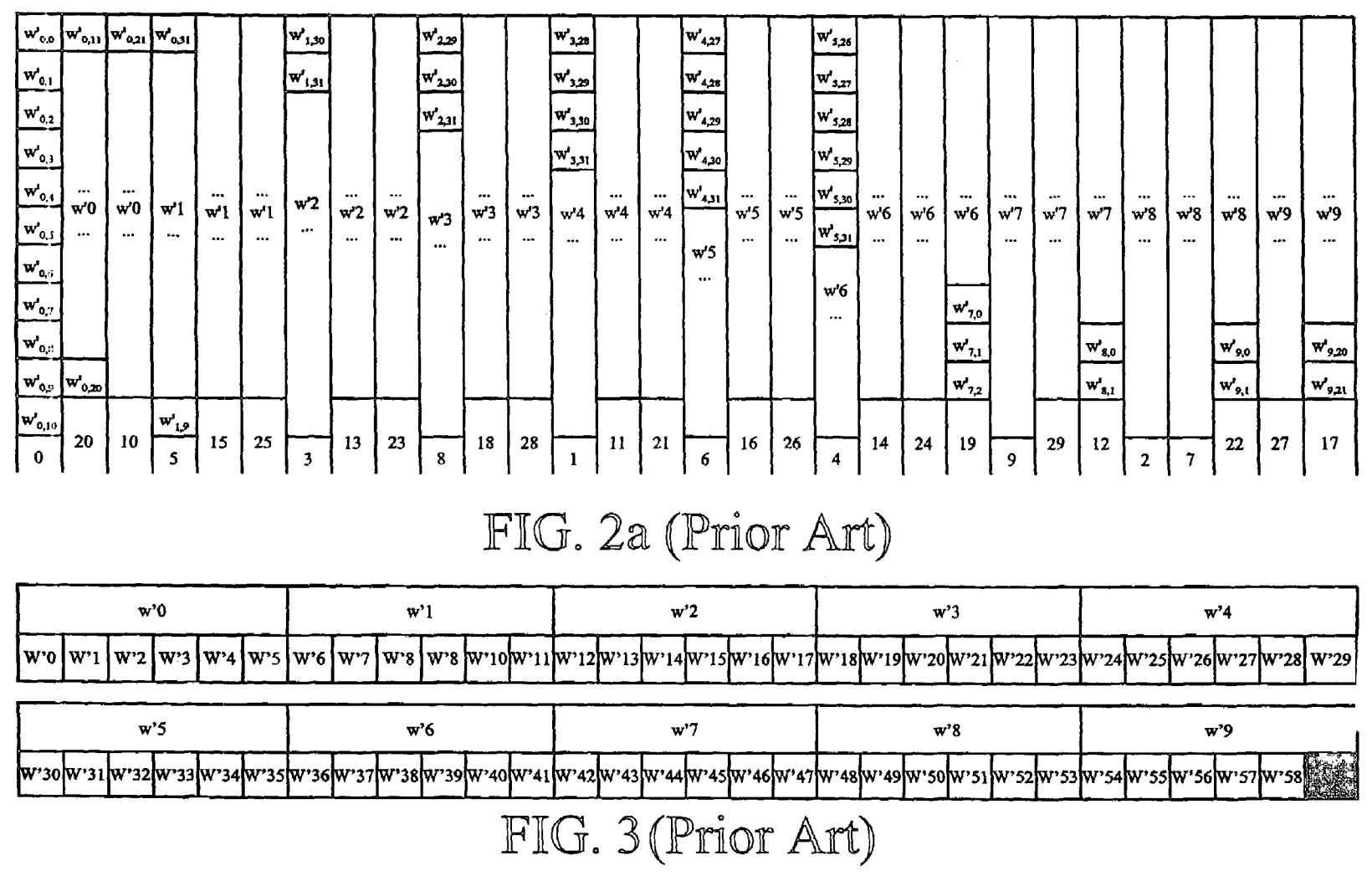

FIG. 2a illustrates a mapping of the data bit block of FIG. 1 onto a block of interleaved bits $W_{\#,\#}$ of words w' in accordance with a current 3G interleaver column sequence specification.

FIG. 2b illustrates a bit mapping for one interleaved word w' from bits of data words w of FIG. 1.

FIG. 3 illustrates an expansion mapping of the interleaved bit block words w' of FIG. 2a onto an expanded set of interleaved six-bit element words W'

FIGS. 4a-4f illustrate a bit mapping of one of the interleaved bit block words w' of FIG. 2a onto a set of six expanded element interleaved words W'.

FIGS. 5a and 5b illustrate a mapping of the bits of the block of expanded interleaved elements of words W' of FIG. 3 onto an interleaver matrix of thirty six-bit element columns.

FIG. 6 illustrates bit and element mapping for one word W of the deinterleaved element block of data on the matrix of FIGS. 5a and 5b.

FIGS. 7a through 7c illustrate a corresponding deinterleaved expanded element and bit mapping of the matrix of FIGS. 5a and 5b and ordering of the set of expanded element words W.

FIG. 8 illustrates the correspondence of the deinterleaved expanded element words W of FIG. 7c with the original data bit block words w of FIG. 1.

DETAILED DESCRIPTION OF THE PREFERRED EMBODIMENTS

Figure 4A:
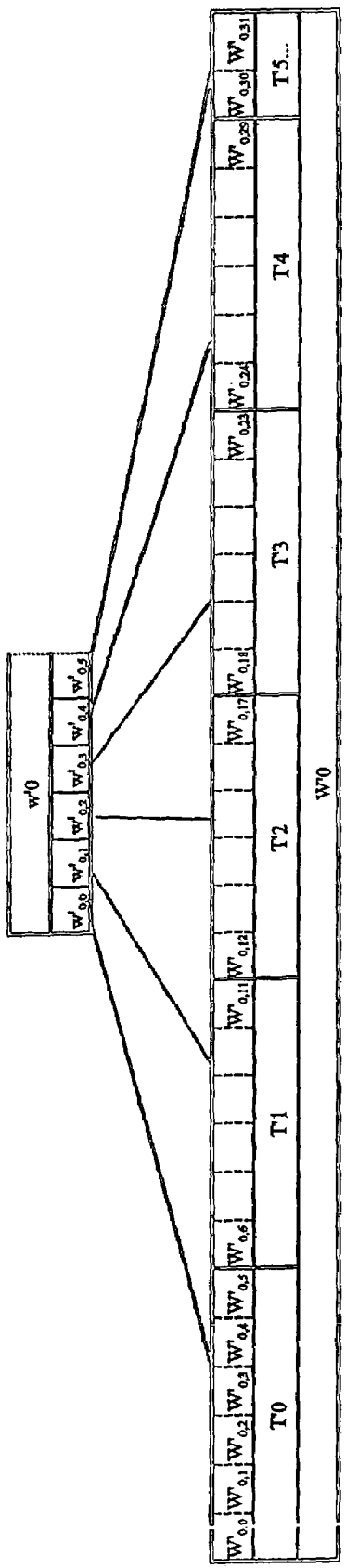
Figure 4B:
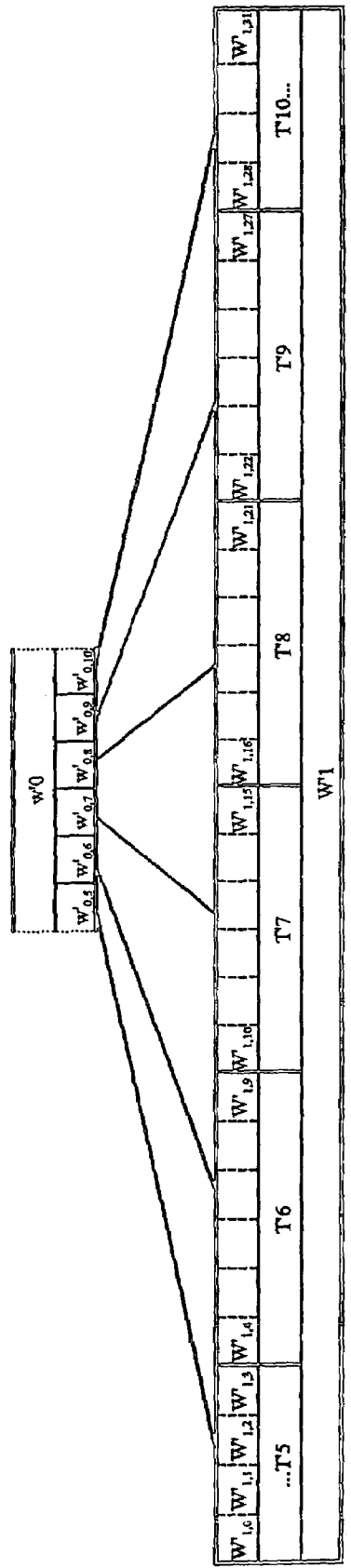
Figure 4C:
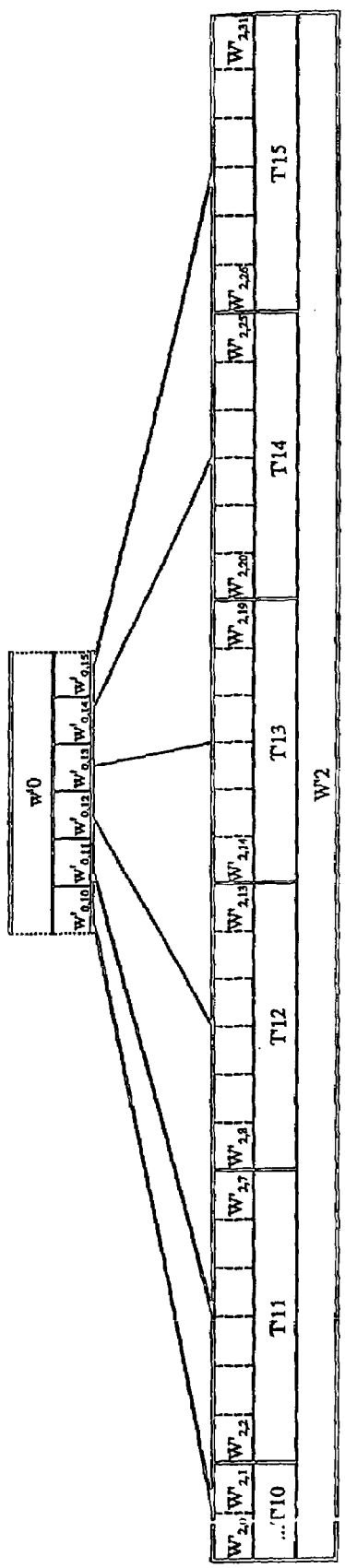
Figure 4D:
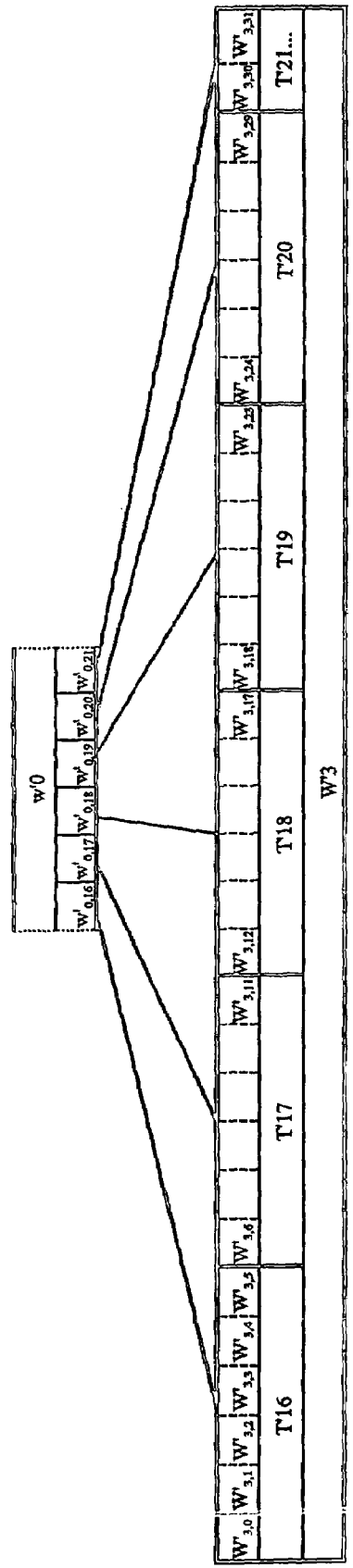
Figure 9:
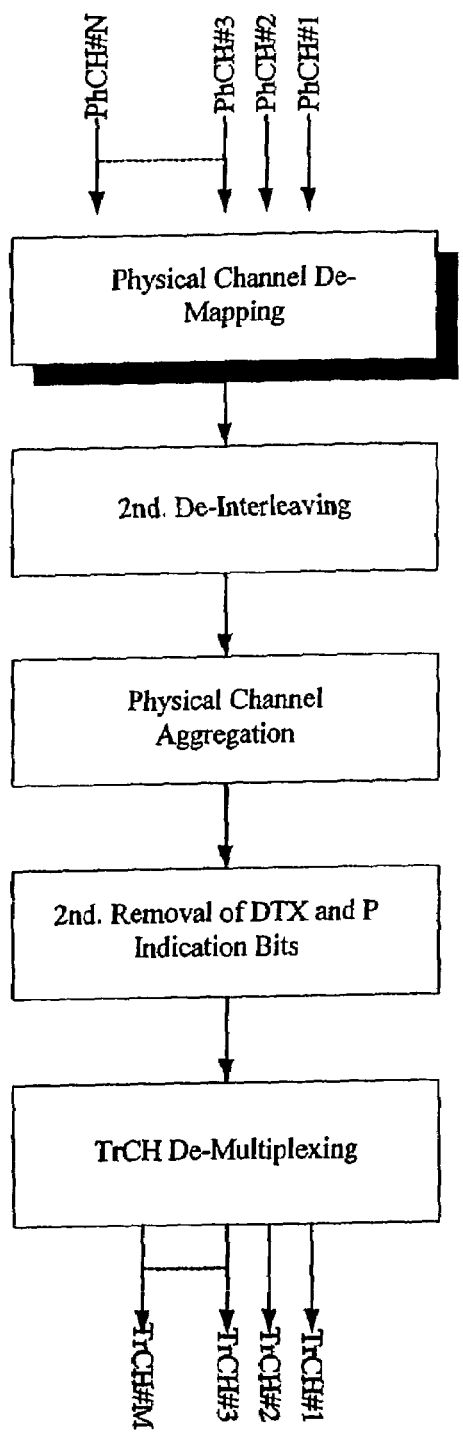
FIG. 9 is a block diagram of receiver processing components of a communication system which utilizes the current invention.

As part of the current 3G specification, blocks of expanded interleaved data, for example, data for physical channels of an FDD receiver are received and must be deinterleaved for further processing. The FDD receiver is divided up into a number of sub-blocks. One of these blocks is called the Receiver Composite Channel (RCC). The RCC block diagram is shown in FIG. 9. It consists of physical channel de-mapping, $2^{nd}$ de-interleaving, physical channel aggregation, $2^{nd}$ stripping of DTX and P indication bits and Transmit Channel (TrCH) demultiplexing. Effectively, the receiver composite channel operations are opposite to functions performed by a transmitter modem in a transmitter composite channel.

The present invention is particularly useful for the architecture of the $2^{nd}$ de-interleaver of an FDD receiver. The bit sequence to be transmitted for each physical channel (PyCH) is scrambled through an interleaver process. In processing, each element of the scrambled bit sequence is typically expanded into equal sized packets; each packet consisting of a small number M of bits. Each of these groups of bits is referred to herein as a data element. In one currently employed receiver for a 3G FDD system, 3G FDD physical channel data element size of received interleaved elements is specified as six bits, i.e. M=6 in the preferred embodiment. FIGS. 1-4 illustrate an example of the transmitter modem interleaving and the subsequent expansion of a 310 data bit block into a block of 310 interleaved six-bit elements T'.

The receiver receives the interleaved data elements over the air, and is faced with the task of deinterleaving data elements which are represented by an expanded bit set, such as the preferred six bit sets illustrated in the example. The receiver stores the interleaved elements in a set of sequential 32-bit data words W'. In the example of FIGS. 1-4, the data block of 310 bits initially stored in 32-bit words w0-w9 on the transmitter side is received and stored as data elements T'0-T'309 in 32-bit words W'0-W'58 on the receiver side.

The $2^{nd}$ interleaver is a block interleaver with inter-column permutations which resequences the interleaved data elements. The interleaving matrix has 30 element columns, numbered 0, 1, 2, ..., 29 from left to right. The number of rows is provided by the user as an external parameter N, but can be calculated for a data block having T elements as the least integer N such that $N*30 \geq T$.

The inter-column permutation pattern for the $2^{nd}$ de-interleaver for a 3G FDD modem is as follows:

TABLE 1

| Inter-Column Permutation Pattern for De-Interleaver | |
| --- | --- |
| Number of columns | Inter-Column Permutation Pattern |
| 30 | {0,20,10,5,15,25,3,13,23,8,18,28,1,11,21, 6,16,26,4,14,24,19,9,29,12,2,7,22,27,17} |

The output of the $2^{nd}$ de-interleaver is a bit sequence read out row by row from a mapping to the inter-column permuted N×30 matrix. Where the entire N×30 matrix is output, the output is pruned by deleting bits that were not present in the input bit sequence of data elements.

Figures 5B, 6:
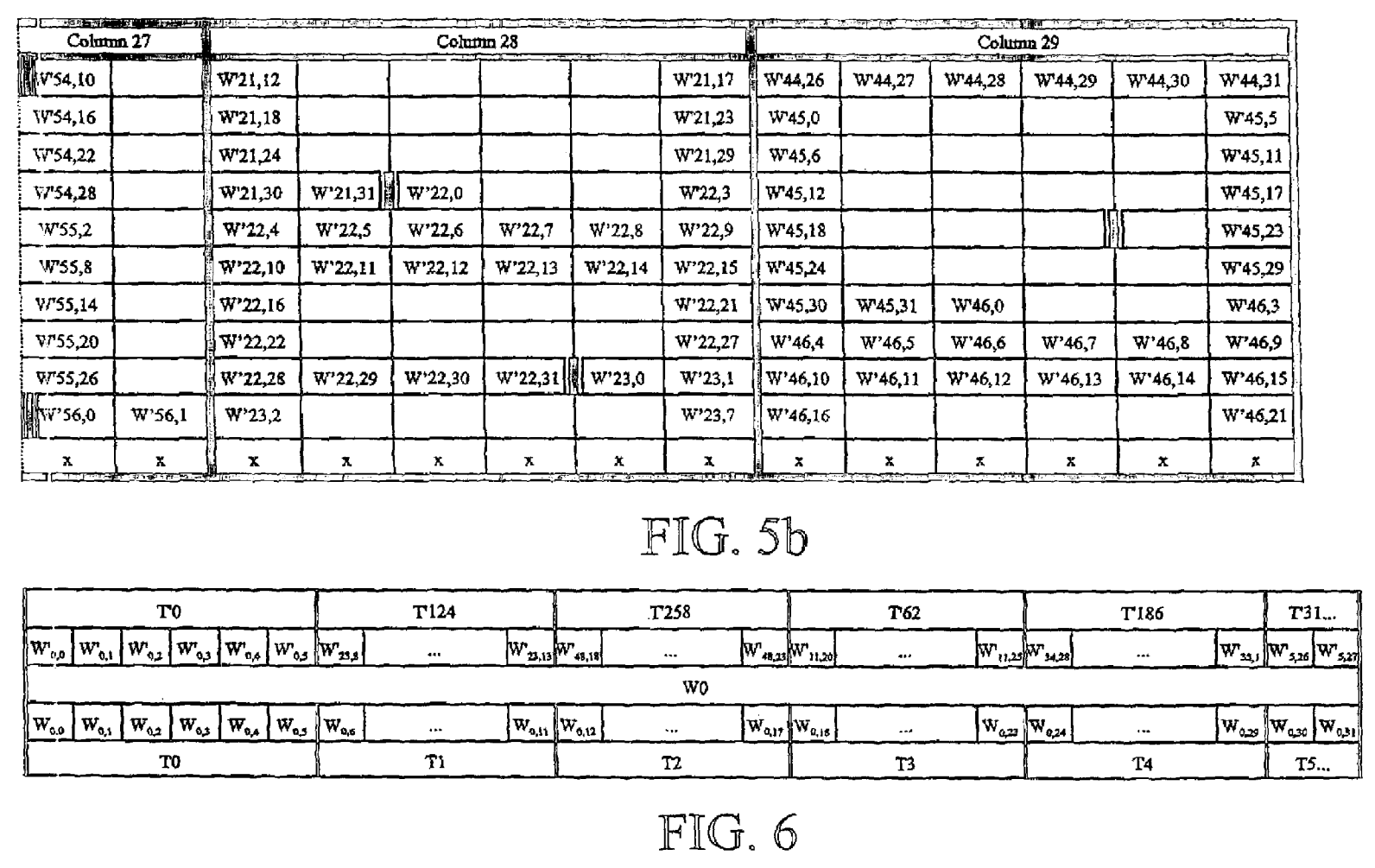

FIGS. 5a and 5b illustrate a bit mapping of the example received data elements T'0-T'309 of left and right portions of an 11 row by 30 element column interleaver matrix. In FIG. 5a, for example, column 0 reflects the bit mapping of the bits of elements T'0-T'10 which are contained in words W'0, W'1 and W'2. The bits of element T'5 are extracted from two words, W'0 and W'1; the bits of element T'10 are extracted from two words, W'1 and W'2. In FIG. 5b, the bottom row has no elements since only the first ten columns are completely filled by the data elements.

Figure 7A:
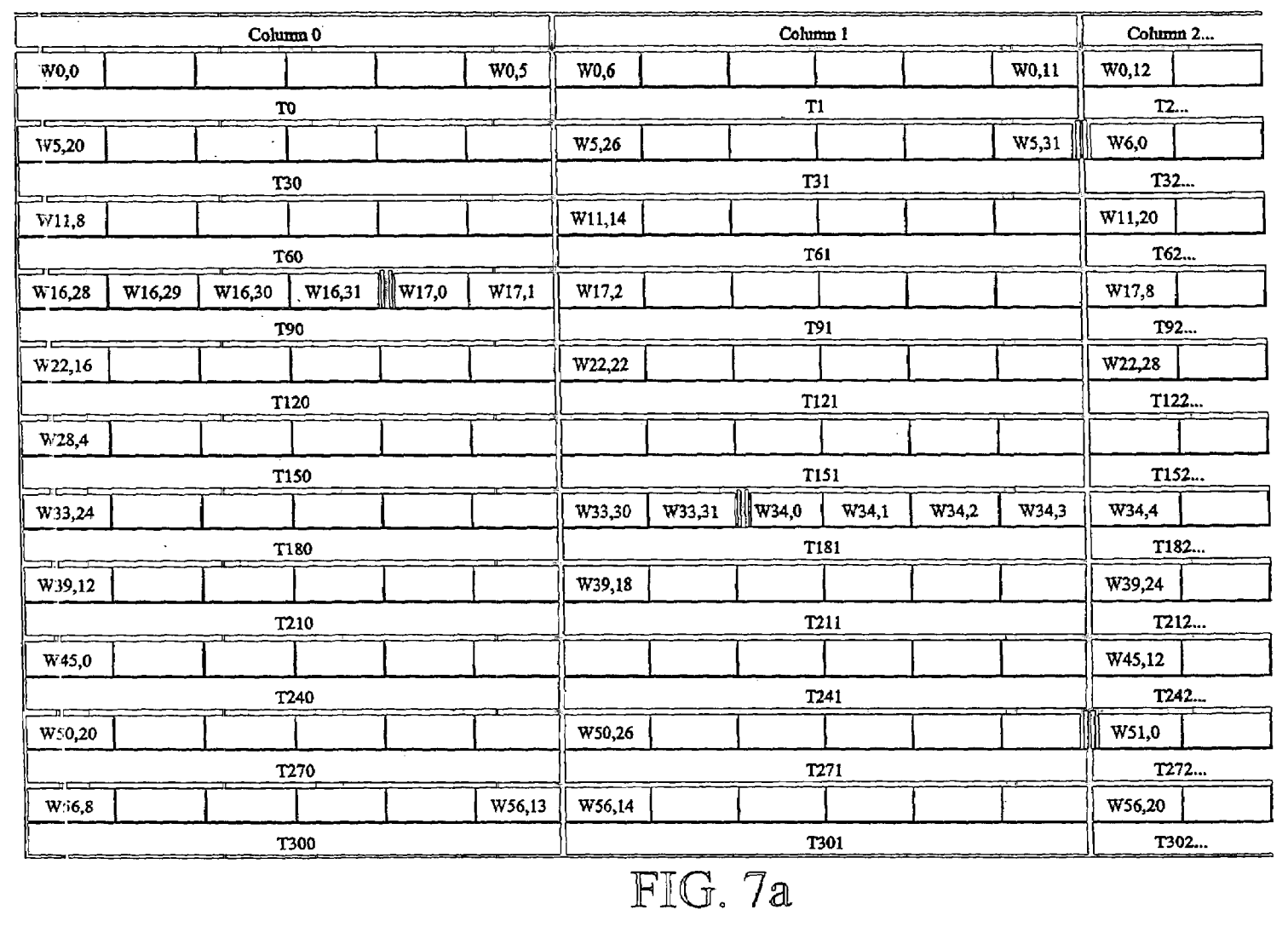
Figure 7B:
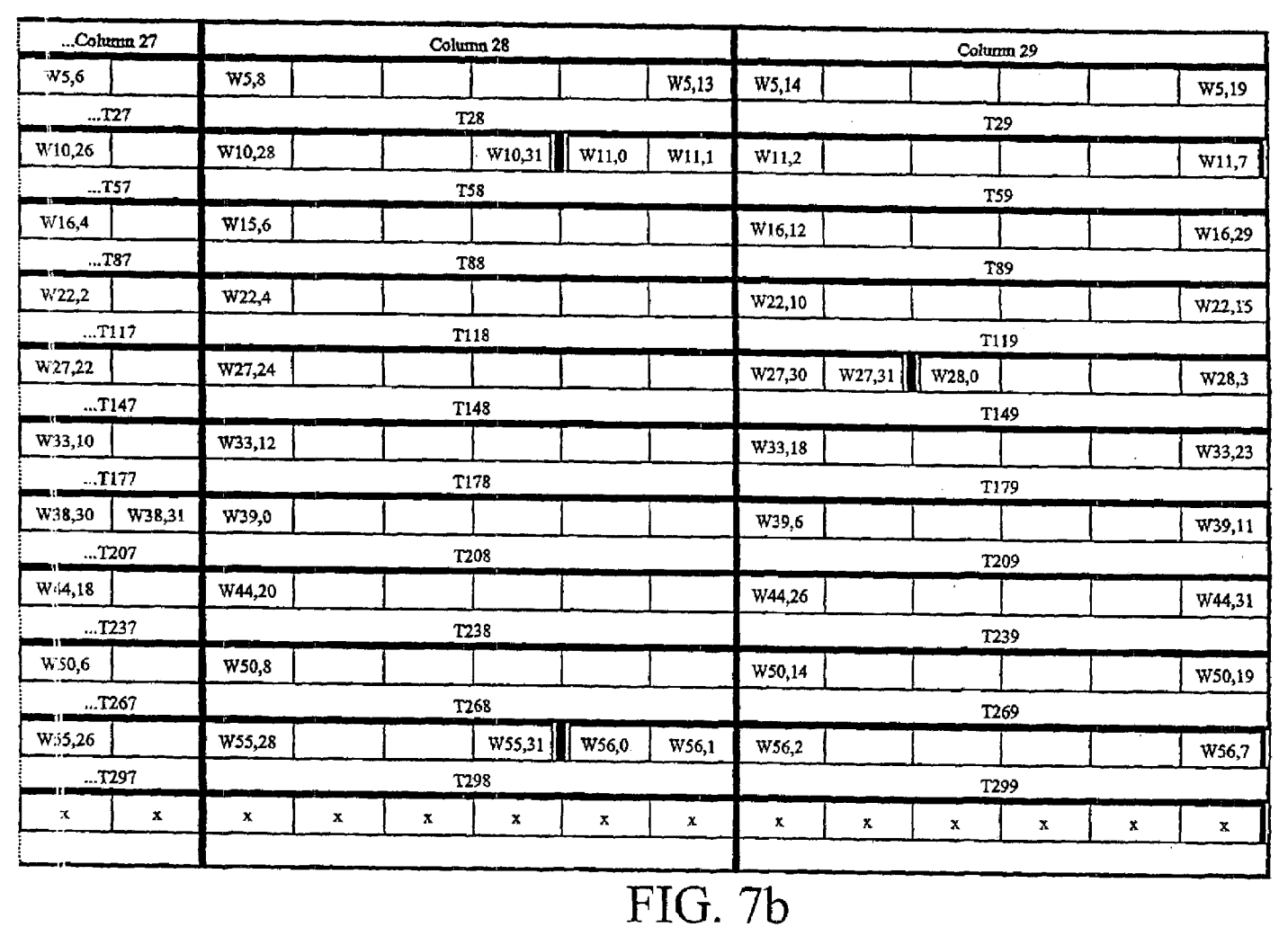
Figures 7C, 8:
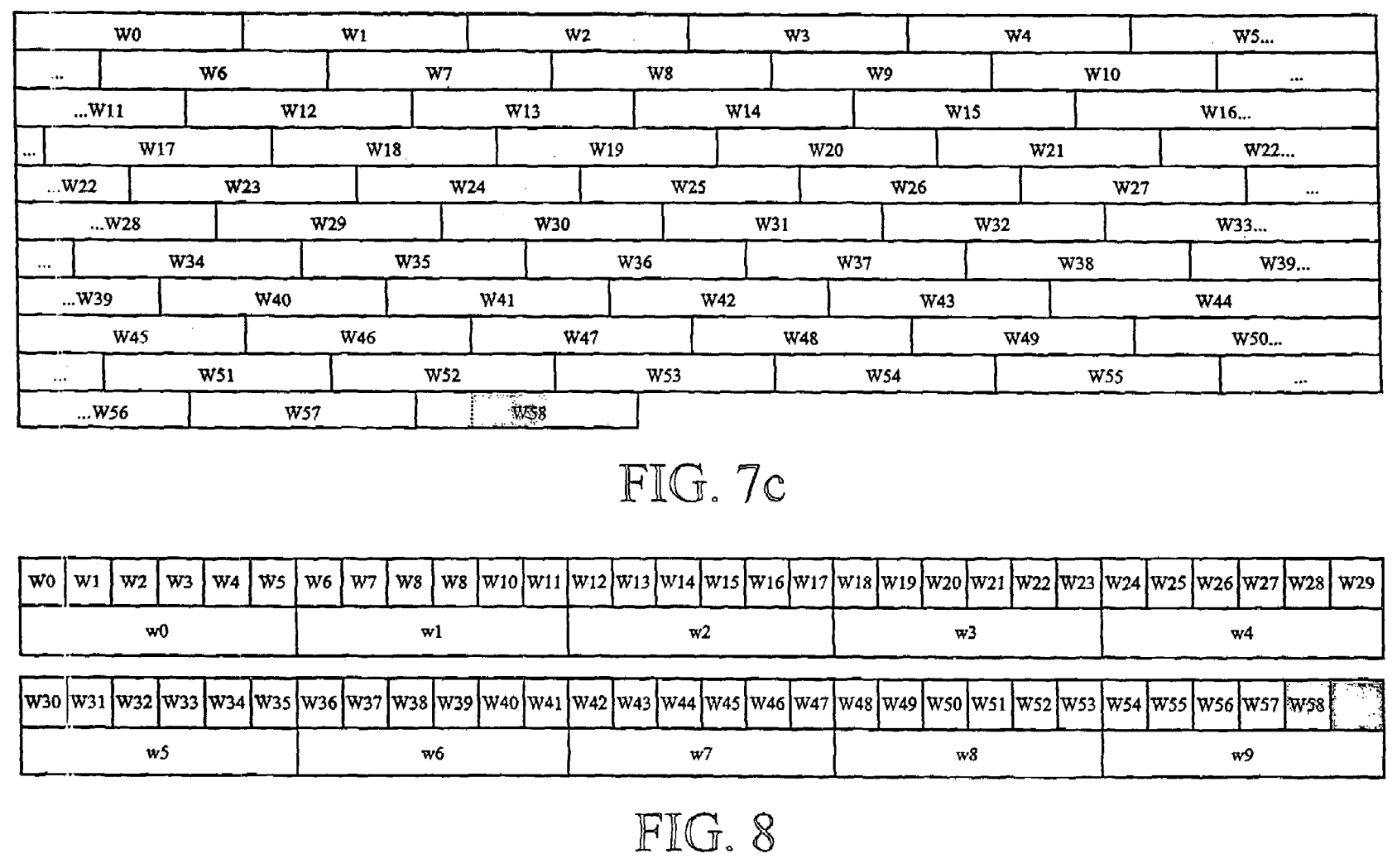

FIGS. 6 and 7a-c reflect how the elements T" are reordered through the selected storing of the elements in a set of words W based on the interleaver matrix mapping. Thus, T'0, T'124, T'258, T'186 and the first two bits of T'31 are stored in the 32 bits of word W0 which, accordingly, correspond to reordered elements T0 through T4 and the first two bits of element T5. As a result of the selective storage of the elements T'0 through T'309 based on the interleaver matrix mapping, a series of 32 bit words W, W0 through W58 is formed containing reordered elements T0 through T309 as shown in FIGS. 7a-7c. FIG. 8 reflects how the original word w0-w9 correspond to words W0-W58 illustrating the correspondence of the reordered elements T0-T309 with the 310 original data block bits $w_{0,0}$-$w_{9,21}$, shown in FIG. 1.

Figure 10A:
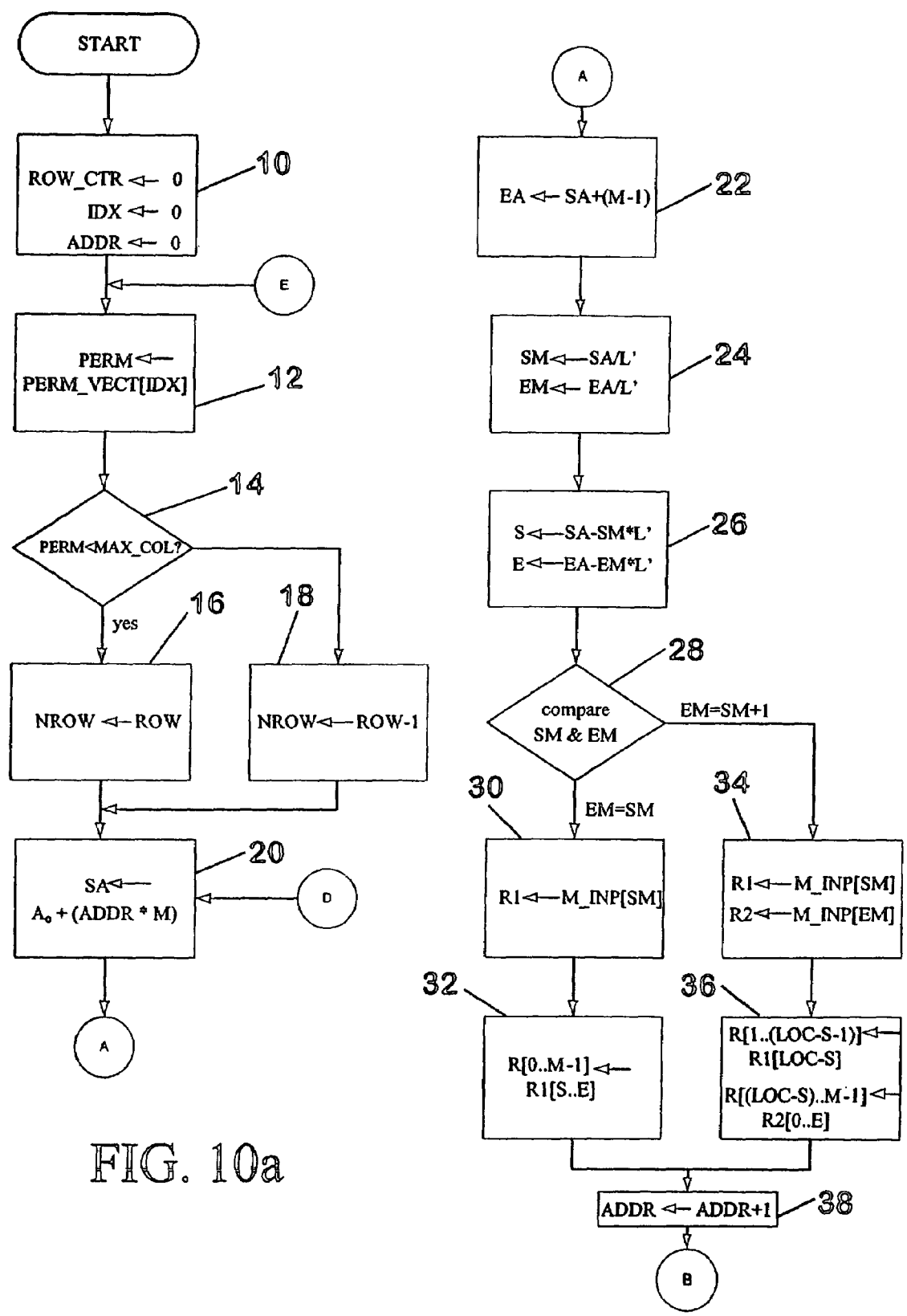
FIGS. 10a and 10b are flow charts of a general method of deinterleaving in accordance with the present invention.
Figure 10B:
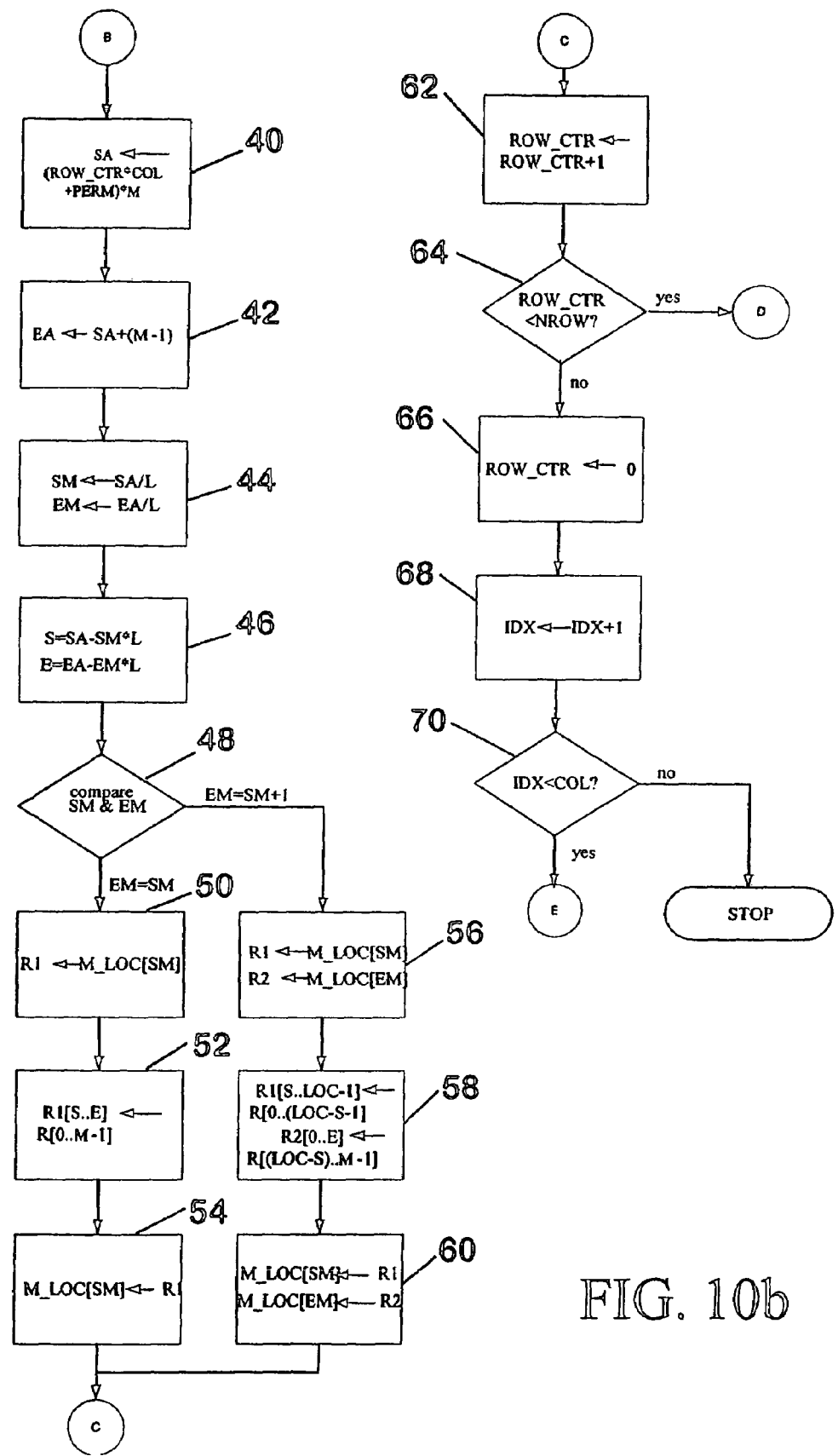

In order to properly place the elements T'0-T'309 in the matrix so that the elements T'0-T'309 can be read out row by row in sequential words W0-W58, each element T' is selectively processed as reflected in the flow charts of FIGS. 10a and 10b.

In the 3G FDD modem receiver, expanded, interleaved data is separated into different physical channels and stored in a random-access-memory (RAM) named M_INP for processing by the deinterleaver. The bit stream is segmented into words of 32-bits, and the words are placed into contiguous locations in M_INP. In the example of FIGS. 1-4, the bit stream for elements T0-T309 which are contained in the words W'0-W'58 would be stored at sequential addresses in M_INP. The flowchart in FIGS. 10a-10b explains how the de-interleaver reads data from M_INP, de-interleaves it and writes it to a local memory M_LOC. The entire process consists of reading the data out, element by element from M_INP, carrying out an address transformation, and writing the element to that location in M_LOC. This location corresponds to the original location of the element in memory before the interleaving was performed at the transmitter. FIGS. 5-8 illustrate the correspondence of the interleaver mapping of elements T'0-T'309 to resequenced elements T0-T309 in words W0-W59 and, in FIG. 8, the correspondence to the original bit sequence contained in word w0-w9 on the transmitter side.

Table 2 provides a list of parameters as used in the flow charts of FIGS. 10a and 10b.

At the start, the variables used in the process are initialized at block 10. The address incrementer ADDR, and row counter ROW_CTR and column index pointer IDX are set to 0. The pre-defined permutation order is stored in a vector named PERM_VECT. The order of the permuted columns within PERM_VECT is preferably as shown in Table 1 for a FDD modem receiver $2^{nd}$ de-interleaver. In step 12, a valve PERM is output from PERM_VECT based on the IDX value which indicates the column position for the current element being processed.

The next several actions 14, 16, 18 determine the number of rows within column number PERM, and sets the variable NROW to this value. A constant parameter MAX_COL is set such that columns 0, 1, 2, . . . , MAX_COL−1 have "ROW" number of rows in them, and columns MAX_COL, . . . , C−1 have "ROW−1" rows in them. Based on this fact and the current value of PERM, the variable NROW is set accordingly.

TABLE 2

List of Flow Chart Parameters

| PARAMETER | DESCRIPTION |
|---|---|
| ADDR | Word address incrementer in M_INP for words W' starting at address $A_0$ |
| T | Total number of elements in data block |
| ROW_CTR (or n) | Counter for counting rows in column PERM. |
| PERM_VECT | Column permutation vector. |
| COL (or C) | Number of columns in permutation matrix. |
| ROW (or N) | Number of rows in permutation matrix. |
| PERM (or i) | PERM_VECT element pointed to by IDX. |
| IDX | PERM_VECT element pointer. |
| MAX_COL | Constant value equal to T − (C * (N − 1)). |
| NROW | Number of rows in column number PERM. |
| SA | Start bit address of element. |
| EA | End bit address of element |
| SM | Start word address of element. |
| EM | End word address of element. |
| S | Start bit location of element within SM. |
| E | End bit location of element within EM. |
| M | Number of bits in each element T'# or T#. |
| R, R1, R2 | Storage registers. |
| L' | Number of bits in each word of set W'. |
| L | Number of bits in each word of set W. |

In steps 20, 22, using the initial address A0, the current ADDR value, and the element size M, start and end bit-addresses, SA and EA respectively, of the current data element within M_INP are determined. Dividing SA and EA by the word bit size L' and discarding any remainder (or equivalently shifting right by 5) per step 24 generates the corresponding word address in the word set W'. These word addresses are SM and EM, respectively. Then in step 26, the start and end bit-locations of the data element within the memory word(s) identified by SM and EM are calculated as S and E, respectively. S and E may be contained within a single memory word of the set of words W', or be spread across two consecutive memory words. The next set of actions 28, 30, 32, 34, 36 demonstrates how these two scenarios are handled.

The next action 28 in the flowchart is to compare the SM and EM word locations. If the element is within a single word of the set of words W', i.e. EM=SM, then in step 30, the word in location SM is fetched from M_INP. The element is then, in step 32, extracted from its bit locations, as indicated by S and E, and the value is assigned to register R. If, on the other hand, the element is contained within two words of the set of words W', i.e. EM=SM+1, two words have to be accessed from M_INP. Accordingly, the word from SM is fetched and assigned to register R1 and the word from EM is fetched and assigned to register R2 is shown in step 34. Then in step 36 the bits of the element are extracted from R1 and R2 and assigned to register R. Thus, in either case, all of the bits of the interleaved element contained in the set of words W' stored in M_INP are extracted. Finally, the address counter ADDR is incremented for initializing the extraction of the next element.

The next set of actions 40-60, shown in FIG. 10b, is to determine the word(s) and bit location within M_LOC where the extracted element will be stored, access the word(s), place the element within appropriate bit locations within the word(s), and write the word(s) back into M_LOC. These steps can be performed as a single read-modify-write operation.

The start and end mapping bit addresses, SA and EA, of where the extracted element is stored in R, in step 32 or 36, will be stored into M_LOC is determined in steps 40-42. The start address is calculated in step 40 based on the row and element column mapping of the element extracted in steps 30, 32 or 34, 36. The matrix position is calculated by multiplying the row number, given by ROW_CTR, by the number of matrix columns, COL, plus the current column number PERM derived from the PERM_VECT vector, i.e. (ROW_CTR*COL)+PERM. Since each element has M bits, the result is multiplied by M to get SA.

Dividing SA and EA by L, the bit size of the words in set W, and discarding the remainder, generates the corresponding word addresses in step 46. These word addresses are SM and EM, respectively. Finally, the start and end bit-locations of where the extracted element in register R is to be placed are computed as S and E, respectively. Where L is not evenly divisible by M, S and E may be contained within a single memory word, or be spread across two consecutive memory words of the set of words W. The next set of actions 48, 60 describe how these two scenarios are handled.

In step 48, the addresses SM and EM are compared. If the extracted element is to be stored is within a single word, i.e. SM=EM, then in step 50 the word in location SM is fetched from M_LOC and placed in register R1. The extracted element value in R is then, in step 52, written to the bit locations indicated by S and E within R1. Finally, R1 is written back into memory location SM of M_LOC in step 54.

If on the other hand, the extracted element is to be stored within two consecutive words having addresses SM and SM+1, those words are fetched in step 56 from M_LOC and placed in registers R1 and R2, respectively. Then, in step 58, the bits of the extracted element within R are placed into appropriate locations in registers R1 and R2, respectively, based upon S and E. Finally, the register contents of R1 and R2 are written back, in step 60, into memory locations SM and SM+1, respectively.

The next action in step 62 is to increment the row counter ROW_CTR by 1 to indicate that the next extracted element T'# will be stored in the next row of the same column. A check is made in step 64 to determine if the row counter is less than or equal to the number of rows of the current column, NROW. If that is the case, the process continues at step 20 with the next element within column member PERM.

If ROW_CTR is not less than NROW, in step 64, the next extracted element will be stored at an address corresponding to the first row (row 0) of the next column indicated by the vector PERM_VECT. Accordingly, if that is the case, ROW_CTR is reset to 0 and the PERM_VECT index, IDX, is incremented by 1 in steps 66, 68. If, in step 70, IDX is less than COL, the de-interleaving process is repeated from step 12 with a new value of PERM being assigned, otherwise the process is stopped since all T elements of the data block will have been processed.

Figure 11A:
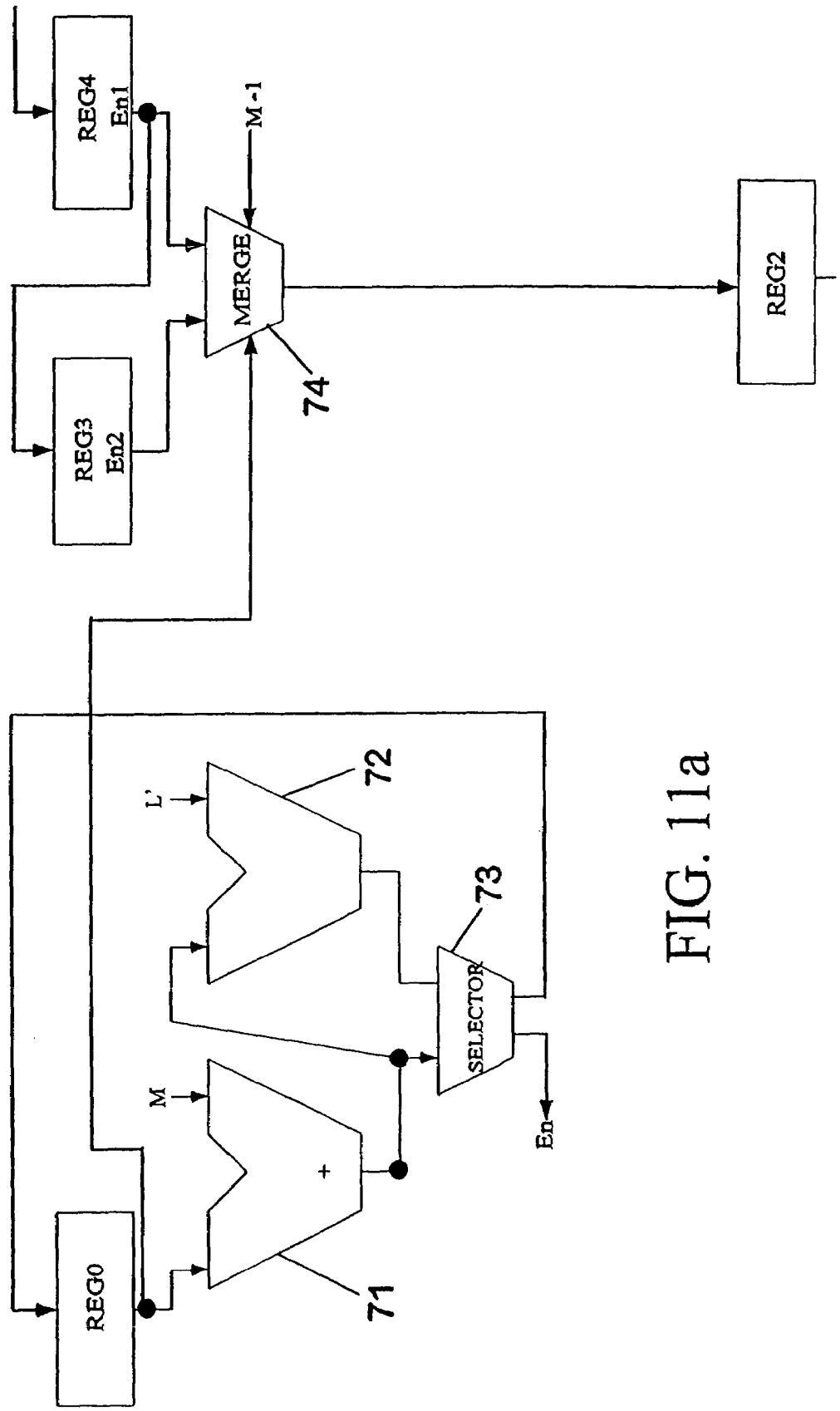
FIGS. 11a-11c are schematic diagrams of a three stage pipeline interleaver in accordance with the present invention.
Figure 11B:
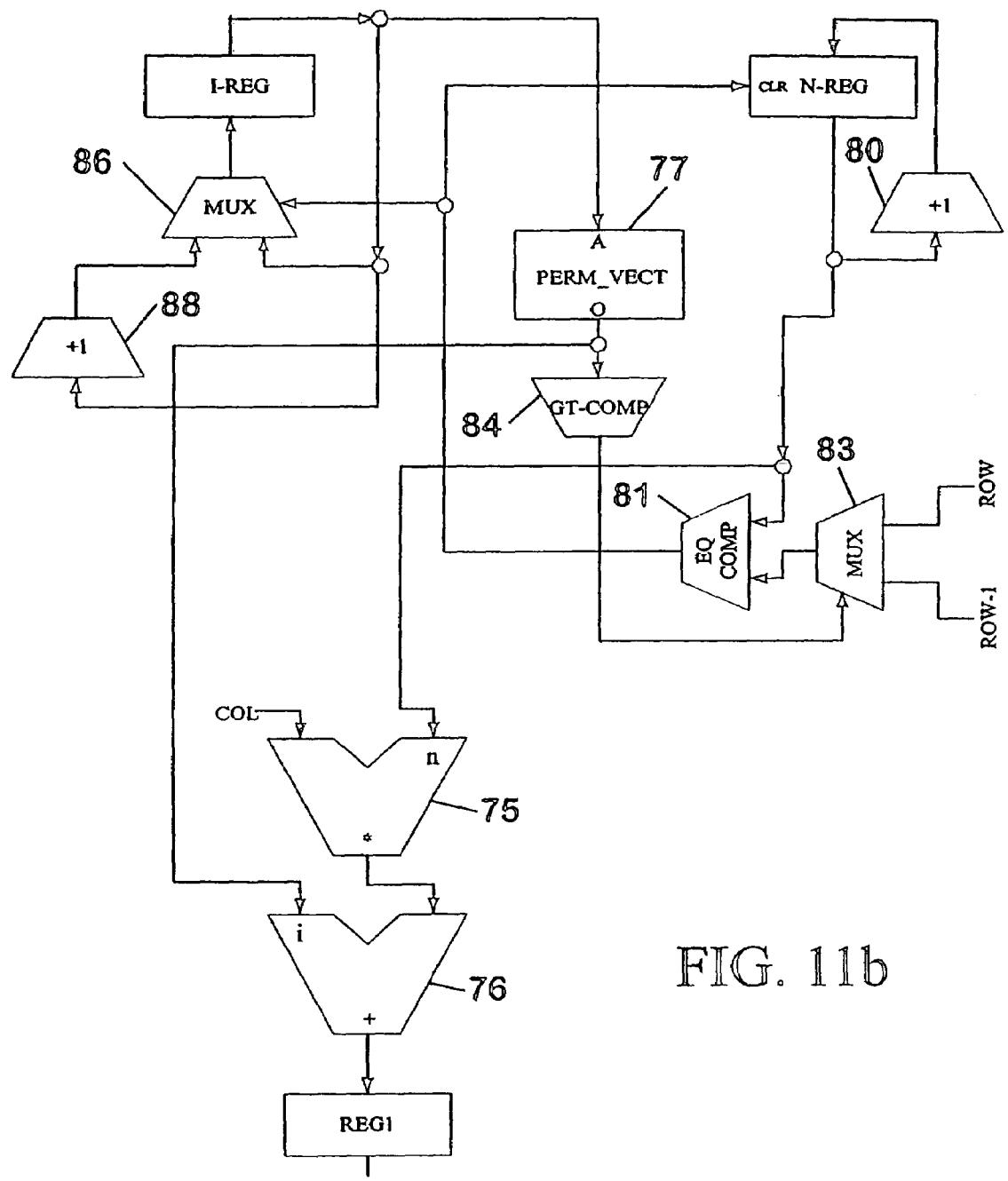
Figure 11C:
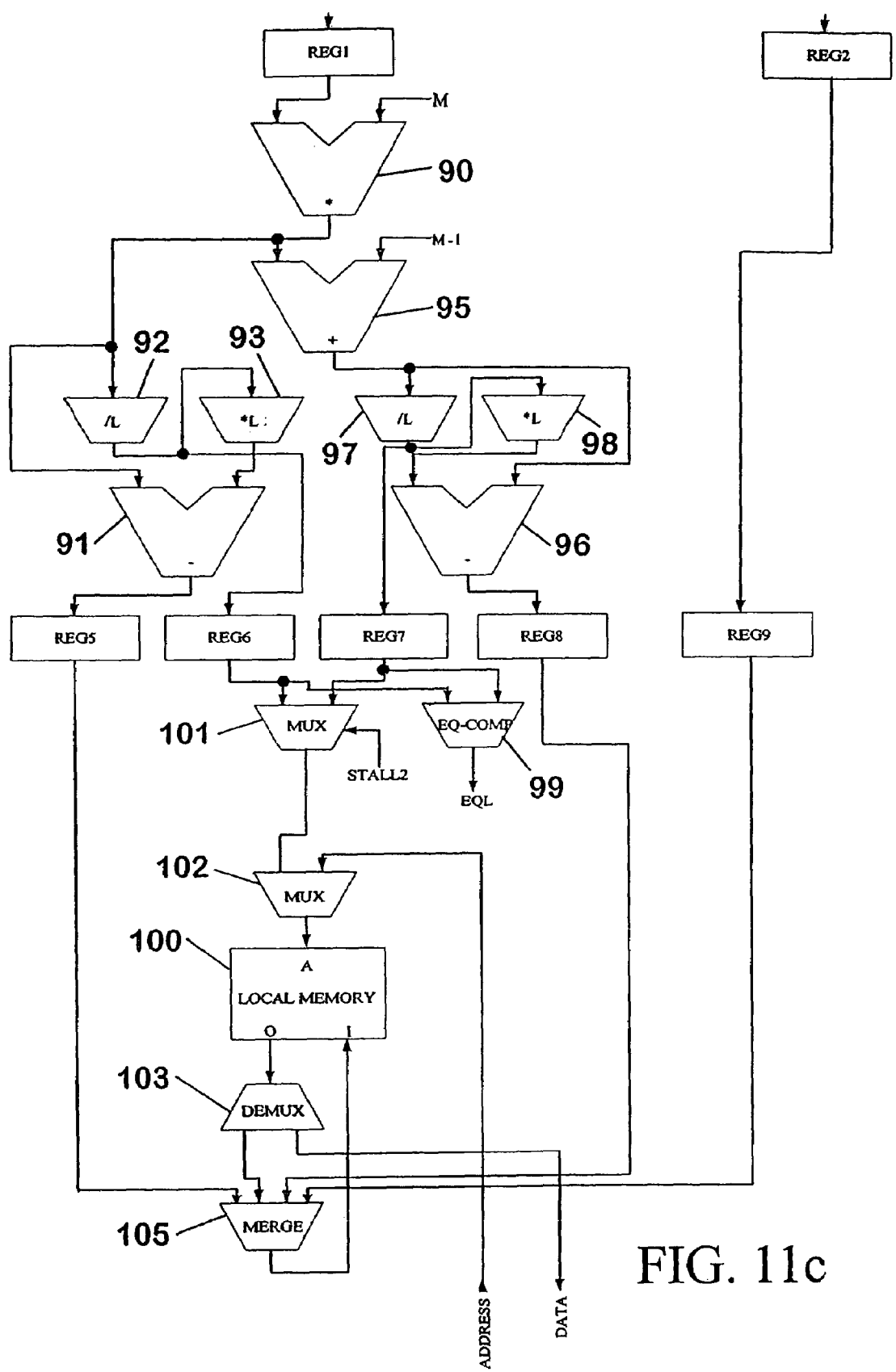

While the general processing method is described in accordance with the flow charts of FIGS. 10*a* and 10*b*, a preferred implementation of the process in hardware is illustrated in FIGS. 11*a*-11*c*. The preferred design consists of a 3-stage pipeline, with an associated memory, LOCAL MEMORY, for storing the deinterleaved bits of data. Parallel processing components of the first stage are illustrated in FIGS. 11*a* and 11*b;* the second and third stage processing is illustrated in FIG. 11*c*.

The operation of stage-1 commences with the extraction of a data element from a 2L'bit vector defined by the contents of two registers REG3 and REG4. The registers REG3 and REG4 store two consecutive L'bit words from physical channel (PyCH) memory. For the preferred 32-bit word size, these two registers form a 64-bit vector of bits.

A register REG0, an adder 71, a substracter 72, and a selector 73, are configured to operate in conjunction with a merge device 74 to extract elements having a size of M bits from registers REG3 and REG4 on a sequential basis and store the element in a register REG2. To initialize the interleaver, first and second words of the sequential words W' are initially stored in registers REG3 and REG4, respectively, and register REG0 is initialized to 0. The merge device 74 receives the value 0 from register REG0, extracts the M bits starting at address 0 through address M−1. Thus, the first M bit from the initial word in REG3, which corresponds to the first element T'0 are extracted. The merge device 74 then stores the extracted M bits in the pipeline register REG2.

The value of register REG0 is incremented by either M via the adder 71 or M−L' via the adder 71 and the substracter 72 based upon the action of the selector 73. If incrementing the value of register REG0 by M does not exceed L', the selector 73 increments register REG0 by M. Otherwise, the selector 73 increments the register REG0 value by M−L'. This effectively operates as a modulo L' function so that the value of REG0 is always less than L' thereby assuring that the start address of the element extracted by the merge device 74 is always within the bit addresses 0−L'−1 of register REG3.

Where the selector 73 selects to increment register REG0 by M−L', a signal EN is sent to trigger the transfer of the contents of REG4 to REG3 and the fetching of the next sequential word of the set of words W' from the external memory for storage in REG4. During the fetch process, the entire pipeline is stalled. The subtracting of L' in conjunction with the incrementing of the value of register REG0 corresponds with the transfer of the word W' in register REG4 to register REG3 so that the sequential extraction of elements is continued with at least the first bit of the element being extracted from the contents of register REG3.

With reference to FIG. 11*b*, an interleaver positioning value is calculated in parallel with the extraction process for the element being extracted. The matrix mapping information is calculated by retrieving a current row value n from a register N-REG, and multiplying it in a multiplier 75 by the number of element columns COL in the interleaver matrix. An adder 76, then adds a current column value i which is output from a register file 77 containing the interleaver column sequence as a vector PERM_VECT. The output of the register file 77 is controlled by the content of an index register I-REG which increments the value of the output of the register file 77 in accordance with the vector PERM_VECT.

The matrix mapping circuitry also include elements to selectively increment the row index register N-REG and the column index register I-REG. The circuitry effectively maintains the same column until each sequential row value has been used and then increments the column to the next column in the interleaver vector starting at the initial row of that column. This is accomplished through the use of a unit incrementer 80 associated with the row register N-REG to increment the row value by one for each cycle of first stage processing. The output of register N-REG is also compared in comparator 81 against a maximum row value determined by a multiplexer 83. The maximum row value for the particular column is either the maximum row value ROW of the entire matrix or ROW−1. The multiplexer 83 generates an output in response to a comparator 84 which compares the column value currently being output by the register file 78 with the largest column value having the maximum row size ROW.

If the comparator 81 determines that the maximum row number has been reached by the output value of register N-REG, the comparator 81 issues a signal to reset N-REG to 0 and to operate a multiplexer (MUX) 86 associated with the index register I-REG. A unit incrementer 88 is also associated with the index register I-REG and the MUX 86 permits incrementation of the I-REG value by one via the incrementer 88 when a signal is received from comparator 81. Otherwise, the multiplexer 86 simply restores the same value to register I-REG during a first stage cycle.

Referring to FIG. 11c, the second stage of the pipeline interleaver comprises a processing cycle where the element extracted and stored in the first pipeline register REG2 is transferred and stored into a second data pipeline register REG9. In parallel in the second stage of processing, the corresponding matrix mapping data stored in register REG1 is used to calculate corresponding start bit address data which is stored in a register REG5, end bit address data which is stored in a register REG8, start word address data which is stored in a register REG6, and end word address data which is stored in a register REG7. During a second stage cycle, the matrix mapping data from REG1 is initially multiplied by the element bit size M in a multiplier 90. The start bit address data is then calculated by subtracting from that resultant value in a subtracter 91 a value to produce a modulo L equivalent, where L is the bit size of the data words of a local memory 100 where the extracted elements are to be selectively stored. The value subtracted in subtracter 91 is calculated by dividing the output of multiplier 90 by L without remainder in divider 92 and multiplying that value by L in multiplier 93. The output of the divider 92 also provides the start word address of the corresponding word within which at least a first portion of an element in register REG9 is to be stored in the local memory 100.

The end bit address data is calculated by adding M−1 to the result of the multiplier 90, in an adder 95 and then subtracting from that value in a subtracter 96 a value calculated to produce a modulo L value which is then stored in register REG8. The value subtracted is derived by dividing the output of the adder 95, in a divider 97, by L without remainder and then multiplying the result by L in a multiplier 98. The output of divider 97 also provides the end word address data which is stored in register REG7.

The third stage of the pipeline interleaver performs a read-modify-write to selectively store the element value in register REG9 in the local memory based upon the data in registers REG5, REG6, REG7 and REG8. Initially, the contents of registers REG6 and REG7 are compared in a comparator 99. If the values are equal, the element in register REG9 will be stored within a single word of the local memory 100. In that case, the value from register REG6 passes through multiplexer 101 to multiplexer 102 where it may be combined with a base address which can be used to allocate overall memory resources within the system.

The output of multiplexer 102 indicates the address of the word W into which the element in register REG9 is to be written. That word is output to a de-multiplexer 103 whereupon a merged device creates a new word comprised of the bit values of the element in register REG9 in the sequential addresses within the word starting with the value in register REG5 and ending with the value in register REG8, with the remaining bits of the word being copied from the values of the word in de-multiplexer 103. The newly formed word in the merge device 105 is then stored back to the address from which the original word was output to the de-multiplexer 103.

Where the contents of registers REG6 and REG7 are different, the first and second stages of the pipeline are stalled for one cycle so that the third stage can perform a read-modify-write cycle with respect to the word identified by the data in register REG6 and then resume the pipeline cycles of all stages to perform a read-modify-write with respect to the local memory word corresponding to the end word data stored in register REG7. In that case, during the read-modify-write cycle with respect to the word corresponding to the start word address data in register REG6, the third stage stores an initial portion of the element stored in register REG9 in the last bits of the local memory word starting with the bit position indicated by the value stored in register REG5. During a second third stage cycle, where the first and second stage cycles are resumed, the remaining portion of the element in register REG9 is stored in the word corresponding to the end word address data in register REG7 starting with the initial bit of that word through the bit address indicated by the value in register REG8.

After all T elements of a block of data bits have been processed, the sequential words of the local memory are read out via the de-multiplexer 103 for further processing in the system. The output of the local memory after processing for the 310 element data block reflected in the example of FIGS. 5-8 correspond to the word sequence reflected in FIG. 7c. During further processing within a 3G system, the expanded six bit elements are contracted to a single bit thereby, for the example, reproducing the original 310 bit data block in the same sequence as originally occurring in the transmitter unit.

Testing of the 3-stage pipeline of the second interleaver was carried out using two different techniques. First of these testing methods was a manual technique called regression. Regression testing was carried out by fetching 30, 32-bit words from the PYCH memory, extracting 6-bit elements from them, and passing them down the pipeline. The testing cycle was based on manual cycle-bases simulation, where the expected contents of the registers and the internal memory were determined by hand. These values were compared with the actual values obtained from simulation. The simulation was carried out for a large number of test cases and for all cases of the pipeline stall condition. The interleaver pipeline was found to function correctly under all the test scenarios of the manual setting.

Next, the interleaver was independently implemented in C-language. A set of test vectors were applied to the C-block and outputs were monitored and written to a results file. The same set of input test vectors were applied to the VHDL model. Two sets of input vectors were used in the tests:

A 201-element input vector and a 540-element input vector. Two different sets of inputs were used to create two different interleaver matrices. The 201-element matrix had two different row sizes; one row is one less than the other one. The 540-element matrix had a single row size. Thus, the tests included the two different types of interleaver matrix structures that are possible. The test results showed that the output vectors from the VHDL model and the C-language model matched the two input cases.

The hardware was synthesized using Synopsys Logic Synthesizer, Using Texas Instruments 0.18 um standard cell library. The gate counts are given below.

TABLE 3

Total gate count estimate for the interleaver

| | |
|---|---|
| Number of Standard Cells (TI/GS30/Std-Cell) | 1034 |
| Sequential gates | 1844 |
| Combination gates | 3348 |
| Total gates | 5192 |

The pipelined architecture ensures a high-rate of throughput, and a small compact area due low number of gates. While a three stage pipeline is preferred, a two stage design is easily implemented by eliminating registers REG1 and REG2 from the preferred system illustrated in FIGS. 11a-11c.

Other variations and modifications will be recognized by those of ordinary skill in the art as within the scope of the present invention.

What is claimed is:

1. A telecommunication station for a wireless communication system wherein blocks of communication data are formatted into a selected sequence through at least on interleaving process for wireless transmission, the station comprising a receiver configured to selectively resequence blocks of T sequential expanded data elements having a bit size M contained in a sequential set of data words W' having a bit size L' to produce a set of sequential data words W having a bit size L containing the T expanded data elements in a selected sequence based upon an interleaver mapping to a matrix having C element columns and N rows where L and L' are integers larger than M, C is not equal to L and the last r columns of the matrix have N−1 rows where r<C and r=(C*N)−T, the receiver including:

extraction components configured to sequentially extract T data elements from a set of sequential data words W';

mapping components configured to determine a matrix mapping position for a first extracted element at a first row of an initial column of a pre-determined interleaver column sequence and, for each subsequent extracted data element, a matrix mapping position of a row n and a column i at a next row of the same column as the immediately preceding data element or, if that column has no next row, the first row of the next column in the pre-determined interleaver column sequence;

said mapping components configured to define a row by row sequential mapping of M bit sequential addresses of a local memory of data words W corresponding to the C by N matrix;

said mapping components configured to determine, for each data element, a sequential bit address within one word or spanning two sequential words of the set of words W corresponding to the element's determined matrix mapping position; and said mapping components configured to store each data element at its determined address.

2. The telecommunication station of claim 1 for a wireless communication system wherein blocks of communication data are formatted into a selected sequence first and second interleaving process for wireless transmission wherein the receiver is configured with a modem which includes said aforementioned means to implement a second deinterleaving process, wherein the receiver modem further comprises:

a retrieval component configured to sequentially read out the data words W from the local memory, after storing a last of the T sequential data element, whereby the T elements are sequentially ordered in a deinterleaved sequence corresponding to a block of T data bits from which the block of T sequential expanded interleaved data elements was created in a transmitter modem.

3. The telecommunication station of claim 1 wherein the extraction components include a component configured to determine a start bit address and an end bit address which corresponds to a data element to be extracted and a component configured to store the data between and inclusive of the determined bit addresses in a register.

4. The telecommunication station of claim 1 wherein the extraction components include first and second registers and a first pipeline register which are operatively associated such that:

a sequential set of data words W' is sequentially read into the first and second registers from which each element is extracted and stored in the first pipeline register;

first and second sequential words of the set of words W' are initially stored in the first and second registers, respectively;

the first data element is extracted from the first M bits the first word in the first register;

each subsequent element is extracted starting with bits of a word in the first register; and after all bits of a word of the set of words W' in the first register have been extracted, the word of the set of words W' in the second register is transferred to the first register and a next sequential word of the set of words W' is stored in the second register.

5. The telecommunication station of claim 4 wherein the first register has addresses A0 through A0+(L'−1) and the second register has addresses A0+L' through A0+(2L'−1) and in operation:

a start address A0+0 is defined for the first data element; and a start address for each subsequent element is defined as address A0+SA of the first register based on a start address A0+SA' of an immediately preceding element such that when SA'+M<L', SA=SA'+M, and when SA'+M≧L, SA=(SA'+M)−L and, before extraction, the word in the second register is stored to the first register and a next sequential word of the set of words W' is stored to the second register.

6. The telecommunication station of claim 4 wherein the matrix mapping components include a matrix position register device configured to receive matrix position data relating to an element being stored in the first pipeline register such that the matrix mapping position row and column for each element is determined in parallel with the storage of an element in the first pipeline register thereby defining a cycle of a first stage of processing.

7. The telecommunication station of claim 6 wherein the mapping components configured to define a row by row sequential mapping of M bit sequential addresses of a local memory are associated with a second pipeline register such that an element in the first pipeline register is stored to the second pipeline register and local memory address information is determined for that element in parallel thereby defining a cycle of a second stage of processing.

8. The telecommunication station of claim 7 wherein the local memory includes bit addresses A'0 through A'0+(T*M)−1 where each sequential word of the set of words W is assigned L sequential bit addresses, and a local memory start address LSA for each data element is determined by LSA=A'0+((n*C)+i)*M) where LSA=A'0 for the first data element.

9. The telecommunication station of claim 8 wherein the first register has addresses A0 through A0+(L'−1) and the second register has addresses A0+L' through A0+(2L'−1) and in operation:
a start address A0+0 is defined for the first data element; and
a start address for each subsequent element is defined as address A0+SA of the first register based on a start address A0+SA' of an immediately preceding element such that
when SA'+M<L, SA=SA'+M, and
when SA'+M≧L, SA=(SA'+M)−L and, before extraction, the word in the second register is stored to the first register and a next sequential word of the set of words W' is stored to the second register.

10. The telecommunication station of claim 7 where the mapping components configured to store each data element at its determined address are operative such that at least a portion of an element in the second pipeline register is stored to a word of the set of words W in the local memory thereby defining a cycle of a third stage of processing.

11. The telecommunication station of claim 10 wherein the mapping components configured to determine, for each data element, a sequential bit address within one word or spanning two sequential words of the set of words W corresponding to the element's determined matrix mapping position are configured such that a local memory start address LSA and a local memory end address LEA is determined for each data element during a second stage processing cycle and when LSA and LEA are in two consecutive words of the set of words W of the local memory, a first portion of the element in the second pipeline register is stored in one of the two words during a third stage processing cycle while the first and second processing stages are stalled for one cycle.

12. The telecommunication station of claim 11 wherein the receiver is configured such that, except for the first and last elements, each time a second stage processing cycle occurs, a first stage processing cycle and a third stage processing cycle also occurs.

13. The telecommunication station of claim 12 wherein the receiver is configured such that first, second and third stage processing is stalled while a word in the second register is transferred to the first register and a next sequential word of the set of words W' is stored in the second register.

14. A telecommunication station for a wireless communication system wherein blocks of communication data are formatted into a selected sequence through at least on interleaving process for wireless transmission, the station comprising an interleaver configured to selectively resequence a block of T sequential data elements having a bit size M contained in a sequential set of data words W' having a bit size L' to produce a set of sequential data words W having a bit size L containing the T data elements in a selected sequence based upon an interleaver mapping to a matrix having C element columns and N rows where L and L' are integers larger than M, C is not equal to L and the last r columns of the matrix have N−1 rows, where r<C and r=(C*N)−T, comprising:
a memory device from which sequential words W' are accessed;
a first pipeline register configured to receive data elements extracted from the memory device;
a matrix position register device configured to receive matrix position data relating to an element being stored in the first pipeline register;
a second pipeline register configured to sequentially receive data elements from the first pipeline register;
a local memory;
a local address register device configured to receive local memory address data relating to an element being stored in the second pipeline register;
first stage processing circuitry including
extraction circuitry configured to sequentially extract data elements from the memory device and store each sequentially extracted element in the first pipeline register, and
matrix mapping circuitry configured to generate and store corresponding matrix position data in the matrix position register device;
second stage processing circuitry configured to generate and store local memory address data in the local address register device from matrix position data stored in the matrix position register device corresponding to an element being transferred from the first pipeline register and stored in the second pipeline register; and
third stage processing circuitry configured to retrieve data elements stored in the second pipeline register and selectively storing each data element in sequential words of the set of words W of the local memory based on the corresponding address data stored in the local address register device.

15. A telecommunication station for a wireless communication system wherein blocks of communication data are formatted into a selected sequence through at least one interleaving process for wireless transmission, the station comprising an interleaver configured to selectively resequence a block of T sequential data elements having a bit size M contained in a sequential set of data words W' having a bit size L' where to produce a set of sequential data words W having a bit size L containing the T data elements in a selected sequence based upon an interleaver mapping to a matrix having C element columns and N rows where L and L' are integers larger than M, C is not equal to L and the last r columns of the matrix have N−1 rows, where r<C and r=(C*N)−T, comprising:
a memory device from which sequential words of the set of words W' are accessed;
a pipeline register device configured to receive data elements extracted from the memory device;
a local memory;
a local address register device configured to receive local memory address data relating to an element being stored in the pipeline register device;
element extracting circuitry configured to sequentially extract data elements from the memory device and store each sequentially extracted element in the pipeline register device;
matrix mapping circuitry configured to generate matrix position data for each extracted element;
address processing circuitry configured to generate and store local memory address data in the local address register device from matrix position data corresponding to an element being stored in the pipeline register device; and
storage processing circuitry configured to sequentially retrieve data elements stored in the pipeline register device and selectively storing each data element in sequential words of the set of words W of the local memory based on corresponding address data stored in the local address register device.

16. A method of deinterleaving a series of bits of received communication data that represent a multiple M of a series of T bits that had been interleaved for transmission based upon a mapping to a matrix having C columns and N rows, where the last r columns of the matrix have N−1 rows and the number of interleaved bits T equals (C*N)−r, the method comprising:

sequentially extracting sets of M data bits from the series of received communication data bits;

determining a matrix mapping position for a first extracted set of M bits at a first row of an initial column of a pre-determined interleaver column sequence;

for each subsequent extracted set of M bits, determining a matrix mapping position of a row n and a column i at a next row of the same column as the immediately preceding set of M bits or, if that column has no next row, the first row of a next column in the pre-determined interleaver column sequence;

defining a row by row sequential mapping of sequential addresses of a local memory;

for each set of M bits, determining a sequential bit address corresponding to the set's determined matrix mapping position; and storing each set of M bits at its determined address.

17. The method of claim 16 wherein the steps are performed in a receiver modem as a second deinterleaving process further comprising:

after storing a last set of M bits, sequentially reading out the stored data bits based on the row by row sequential mapping of sequential addresses of the local memory whereby the series of received communication data bits are sequentially ordered in a deinterleaved sequence corresponding to the series of T bits that had been interleaved for transmission prior to interleaving.

18. The method of claim 16 wherein:

each successive set of M bits is extracted and stored in a first pipeline register; and the matrix mapping position row and column for each set of M bits is determined in parallel with the storage of a set of M bits in the first pipeline register thereby defining a cycle of a first stage of processing.

19. The method of claim 18 wherein a set of M bits in the first pipeline register is stored to a second pipeline register and local memory address information is determined for that set of M bits in parallel thereby defining a cycle of a second stage of processing.

20. The method of claim 19 where at least a portion of a set of M bits in the second pipeline register is stored to the local memory thereby defining a cycle of a third stage of processing.

21. A telecommunication station for a wireless communication system wherein deinterleaving is performed on series of bits of received communication data that represent a multiple M of a series of T bits that had been interleaved for transmission based upon a mapping to a matrix having C columns and N rows, where the last r columns of the matrix have N−1 rows and the number of interleaved bits T equals (C*N)−r, comprising:

extraction components configured to sequentially extract sets of M data bits from the series of received communication data bits;

mapping components configured to determine a matrix mapping position for a first extracted set of M bits at a first row of an initial column of a pre-determined interleaver column sequence;

said mapping components configured to determine a matrix mapping position, for each subsequent extracted set of M bits, of a row n and a column i at a next row of the same column as the immediately preceding set of M bits or, if that column has no next row, the first row of a next column in the pre-determined interleaver column sequence;

said mapping components configured to determine define a row by row sequential mapping of sequential addresses of a local memory;

said mapping components configured to determine a sequential bit address, for each set of M bits, corresponding to the set's determined matrix mapping position; and said mapping components configured to store each set of M bits at its determined address.

22. The telecommunication station of claim 21 wherein the extraction and mapping components are incorporated into a receiver modem configured to implement said deinterleaving as a second deinterleaving process that further includes a retrieval component configured to sequentially read out the stored data bits, after storing a last set of M bits, based on the row by row sequential mapping of sequential addresses of the local memory whereby series of received communication data bits are produced that are sequentially ordered in a deinterleaved sequence corresponding to series of T bits that had been interleaved for transmission prior to interleaving.

23. The telecommunication station of claim 21 wherein:

the extraction components are configured such that each successive set of M bits is extracted and stored in a first pipeline register; and the mapping components configured to determine a matrix mapping position are configured such that the matrix mapping position row and column for each set of M bits is determined in parallel with the storage of a set of M bits in the first pipeline register thereby together defining first stage processing circuitry.

24. The telecommunication station of claim 23 wherein the mapping components configured to determine a sequential bit address are configured such that local memory address information is determined for a set of M bits in the first pipeline register in parallel with storing that set of M bits to a second pipeline register to thereby define second stage processing circuitry.

25. The telecommunication station of claim 24 the mapping components configured to store each set of M bits are configured such that at least a portion of a set of M bits in the second pipeline register is stored to the local memory for each second stage processing of a set of M bits to thereby define third stage processing circuitry.

26. The telecommunication station of claim 25 wherein said first stage processing circuitry, said second stage processing circuitry and said third stage processing circuitry are implemented in a receiver modem that further includes a retrieval component configured to sequentially read out stored data bits, after storing a last set of M bits, based on the row by row sequential mapping of sequential addresses of the local memory whereby series of received communication data bits produced that are sequentially ordered in a deinterleaved sequence corresponding to series of T bits that had been interleaved for transmission prior to interleaving.

* * * * *

UNITED STATES PATENT AND TRADEMARK OFFICE
CERTIFICATE OF CORRECTION

PATENT NO. : 7,317,762 B2 Page 1 of 1
APPLICATION NO. : 11/141961
DATED : January 8, 2008
INVENTOR(S) : Sharif M. Shahrier It is certified that error appears in the above-identified patent and that said Letters Patent is hereby corrected as shown below:

At column 4, line 15, before the words "is scrambled", delete "PyCH" and insert --PhCH--.

At column 5, line 3, after the word "elements", delete "T′′′" and insert therefor --T′--.

At column 5, line 55, after the words "step 12, a", delete "valve" and insert therefor --value--.

At column 11, line 12, after the word "due", insert --to--.

At claim 1, column 11, line 23, after the words "at least", delete "on" and insert therefor --one--.

At claim 14, column 13, line 49, after the words "at least", delete "on" and insert therefor --one--.

Signed and Sealed this

Eighth Day of July, 2008

JON W. DUDAS
*Director of the United States Patent and Trademark Office*